United States Patent
Morisada (10) Patent No.: US 6,760,079 B2
(45) Date of Patent: *Jul. 6, 2004

(54) TV TUNER UNIT HAVING A RESONANCE NETWORK

(75) Inventor: Katsuhiro Morisada, Tsuyama (JP)

(73) Assignee: Funai Electric Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/342,050

(22) Filed: Jun. 28, 1999

(65) Prior Publication Data

US 2003/0133048 A1 Jul. 17, 2003

Related U.S. Application Data

(60) Provisional application No. 60/101,398, filed on Sep. 22, 1998.

(51) Int. Cl.[7] .............................. H04N 5/44; H04N 5/50
(52) U.S. Cl. ....................... 348/731; 348/733; 348/735; 348/737; 455/180.1; 455/180.2; 455/188.1; 455/188.2; 455/191.1; 455/191.2
(58) Field of Search ................................ 348/731, 732, 348/733, 735, 737; 455/180.1, 180.2, 188.1, 188.2, 191.1, 191.2, 191.3; H04N 5/50, 5/44

(56) References Cited

U.S. PATENT DOCUMENTS

| | | | | |
|---|---|---|---|---|
| 4,271,529 A | * | 6/1981 | Strammello, Jr. | 334/15 |
| 4,352,111 A | * | 9/1982 | Carlson et al. | 343/853 |
| 4,442,548 A | * | 4/1984 | Lehmann | 330/305 |
| 4,499,495 A | | 2/1985 | Strammello | |
| 4,598,425 A | | 7/1986 | Skerlos et al. | |
| 5,574,997 A | * | 11/1996 | Hong | 455/180.1 |
| 5,737,035 A | * | 4/1998 | Rotzoll | 348/725 |
| 5,815,218 A | * | 9/1998 | Maeda | 332/141 |
| 5,859,674 A | * | 1/1999 | Chevallier | 348/731 |
| 6,091,931 A | * | 7/2000 | Ben-Efraim et al. | 455/3.02 |
| 6,108,050 A | * | 8/2000 | Yamamoto et al. | 348/731 |
| 6,188,447 B1 | * | 2/2001 | Rudolph et al. | 348/553 |
| 6,236,437 B1 | * | 5/2001 | Suzuki et al. | 343/720 |
| 6,351,294 B1 | * | 2/2002 | Yamamoto et al. | 348/729 |
| 6,392,715 B1 | * | 5/2002 | Sato et al. | 348/731 |
| 6,452,645 B1 | * | 9/2002 | Kuhn et al. | 348/731 |

* cited by examiner

*Primary Examiner*—John Miller
*Assistant Examiner*—Brian Yenke
(74) *Attorney, Agent, or Firm*—Morgan, Lewis & Bockius LLP (57) ABSTRACT

A TV tuner unit uses a frequency-selective element before or after the resonance stage of either a UHF or VHF tuner for separation of UHF signals from VHF signals. Thus, performance is preserved while eliminating the need for circuitry including high and low pass filters and related switches.

25 Claims, 7 Drawing Sheets

RELATED ART

FIG. 6

RELATED ART

FIG. 7
RELATED ART

TV TUNER UNIT HAVING A RESONANCE NETWORK

This application claims the benefit of U.S. Provisional Application No. 60/101,398, filed Sep. 22, 1998, which is hereby incorporated by reference.

BACKGROUND OF THE INVENTION

1. Field of the Invention

The present invention relates to tuner units of TV sets. More particularly, the present invention relates to a tuner unit configured to operate without necessitating the use of high and low pass filters and other related components.

2. Description of the Related Art

In a conventional tuner unit of a TV set, where RF signals of both UHF and VHF channels as received by an antenna are all input to a single antenna input terminal, a single tuner unit which separately processes both UHF and VHF input signals with its UHF and VHF tuners is typically used. To do this, the antenna input terminal connects through an HPF (High Pass Filter) and a switch to a UHF tuner, and also connects through an LPF (Low Pass Filter) and a switch to a VHF tuner, so that a combination of an HPF (or LPF) and a switch allows only UHF (or VHF) input signals to reach the UHF (or VHF) tuner.

Specifically, with a conventional tuner unit, both an HPF and an LPF are necessary to divide the input signals from an antenna terminal into higher and lower frequencies. Two switches are also necessary to block unnecessary signal components which may pass through these filters.

Figure 7:
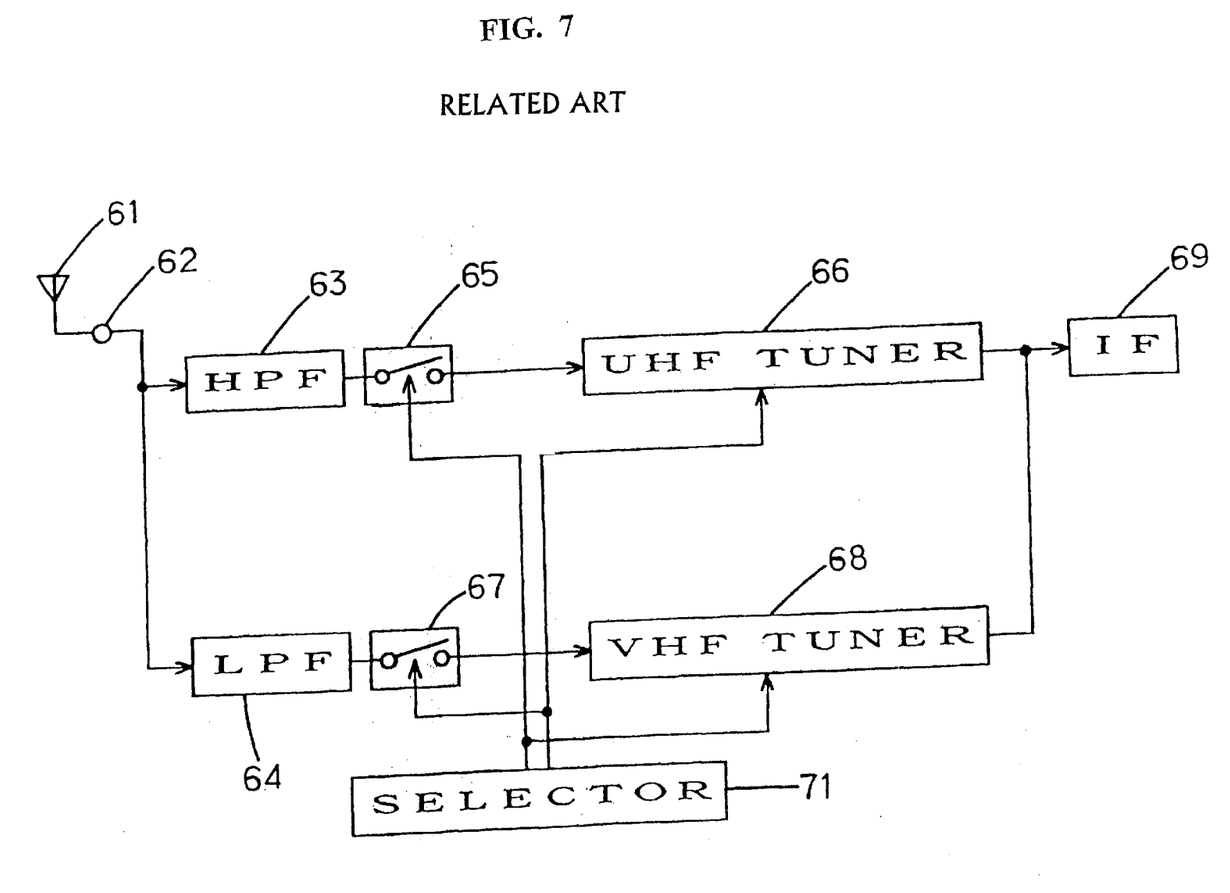
FIG. 7 is a block diagram of a conventional TV tuner unit.

FIG. 7 is a block diagram showing the system configuration of a conventional tuner unit.

In FIG. 7, an antenna 61 connects through an input terminal 62 to both an HPF 63 and an LPF 64, where the HPF 63 passes only UHF frequencies and the LPF 64 passes only VHF frequencies.

The output from the HPF 63 connects through a switch 65 to a UHF tuner 66. The output from the LPF 64 connects through a switch 67 to a VHF tuner 68. The output from the UHF tuner 66 and that from the VHF tuner 68 are combined and input to an intermediate-frequency amplifier circuit (IF circuit) 69. The switch 65 and the UHF tuner 66, or the switch 67 and the VHF tuner 68, are selected by a channel selector 71.

In other words, a conventional tuner unit requires an HPF 63 (or LPF 64) and a switch 65 (or 67) between an input terminal 62 and a UHF tuner 66 (or VHF tuner 68) as a pre-stage for the UHF tuner 66 (or VHF tuner 68). While the HPF 63, LPF 64, switch 65, and switch 67 are all indispensable in the conventional tuner unit to ensure satisfactory tuner performance (selectivity), they not only add to the cost of the tuner unit but also complicate its design and adjustment.

It is known that selectivity and other major characteristics of a tuner unit so depend on the pre-stage of the tuners that the performance of the pre-stage determines that of the whole tuner unit. Some conventional tuner units are shown in U.S. Pat. Nos. 4,598,425 and 4,499,495. These documents are incorporated herein by reference.

U.S. Pat. No. 4,598,425 defines a tuner unit which receives UHF, VHF and CATV signals collectively from a common input terminal through a network of a filter and a switch to either a higher-frequency tuner or a lower-frequency tuner to process higher and lower frequencies separately. The network is controlled depending on what channel a user selects.

U.S. Pat. No. 4,499,495 defines a tuner unit which receives UHF and VHF signals collectively from a common input terminal through a UHF/VHF selector switch to either a UHF tuner or a VHF tuner to process UHF and VHF signals separately. The mixed UHF and VHF signals pass through a filter network to the VHF tuner/but cannot reach the UHF tuner because of an open UHF/VHF selector switch before it when a VHF channel is selected; and pass through a closed UHF/VHF selector switch to the UHF tuner but cannot reach the VHF tuner because it is grounded by the UHF/VHF selector switch when a UHF channel is selected.

SUMMARY OF THE INVENTION

The present invention has been made in view of the above circumstances and has as an object to provide a simplified TV tuner unit which eliminates HPF 63 and LPF and 64, and switches 65 and 67, such as shown in FIG. 7, but is still capable of tuning in to either UHF or VHF signals satisfactorily.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects in accordance with the purpose of the invention, as embodied and broadly described herein, the invention includes a television tuner unit comprising a television signal input terminal providing both UHF and VHF input signals; a UHF tuner having a UHF resonance circuit for tuning to a desired channel in response to application of a tuning voltage to the UHF resonance circuit; a VHF tuner comprising a VHF resonance circuit for tuning to a desired channel in response to application of a tuning voltage to the VHF resonance circuit; and a resonance network, included in at least one of the UHF tuner and the VHF tuner, for controlling selection of which one of either the UHF input signals and the VHF input signals from the television signal input terminal are to be applied to the resonance circuit of the tuner in which the resonance network is included.

With a tuner unit according to the present invention, a common antenna input terminal connects directly to both UHF and VHF tuners of the tuner unit. The UHF and VHF tuners include as a pre- or post-stage an additional resonance network configured around a variable-capacitance diode to improve tuning performance.

More specifically, simply eliminating HPF and LPF filters and switches from a conventional tuner unit would result in a system in which not only wanted signals but also unwanted signals are input to the first-stage amplifier of a tuner, producing various combinations of beat and thereby adversely affecting tuning performance. Thus, the present invention provides a tuner with an additional resonance network to provide a result (obtain only wanted signals by attenuating unwanted ones) corresponding to that previously provided by the HPF and LPF and switches of the prior art.

As mentioned earlier, selectivity and other major characteristics of a tuner unit so depend on the pre-stage of the tuners that the performance of the pre-stage determines that of the whole tuner unit. To improve selectivity at the earliest stage, therefore, the present invention incorporates a frequency-selective element (for example, a variable-capacitance diode) as the pre- or post-stage of a resonance stage.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate at least one embodiment of the invention and, together with the description, serve to explain the principals of the invention. In the drawings.

DETAILED DESCRIPTION OF THE PREFERRED EMBODIMENT(S)

Reference will now be made in detail to the present preferred embodiment(s) of the invention, examples of which are illustrated in the accompanying drawings. Wherever possible, the same reference numbers will be used throughout the drawings to refer to the same or like parts.

Figure 1:
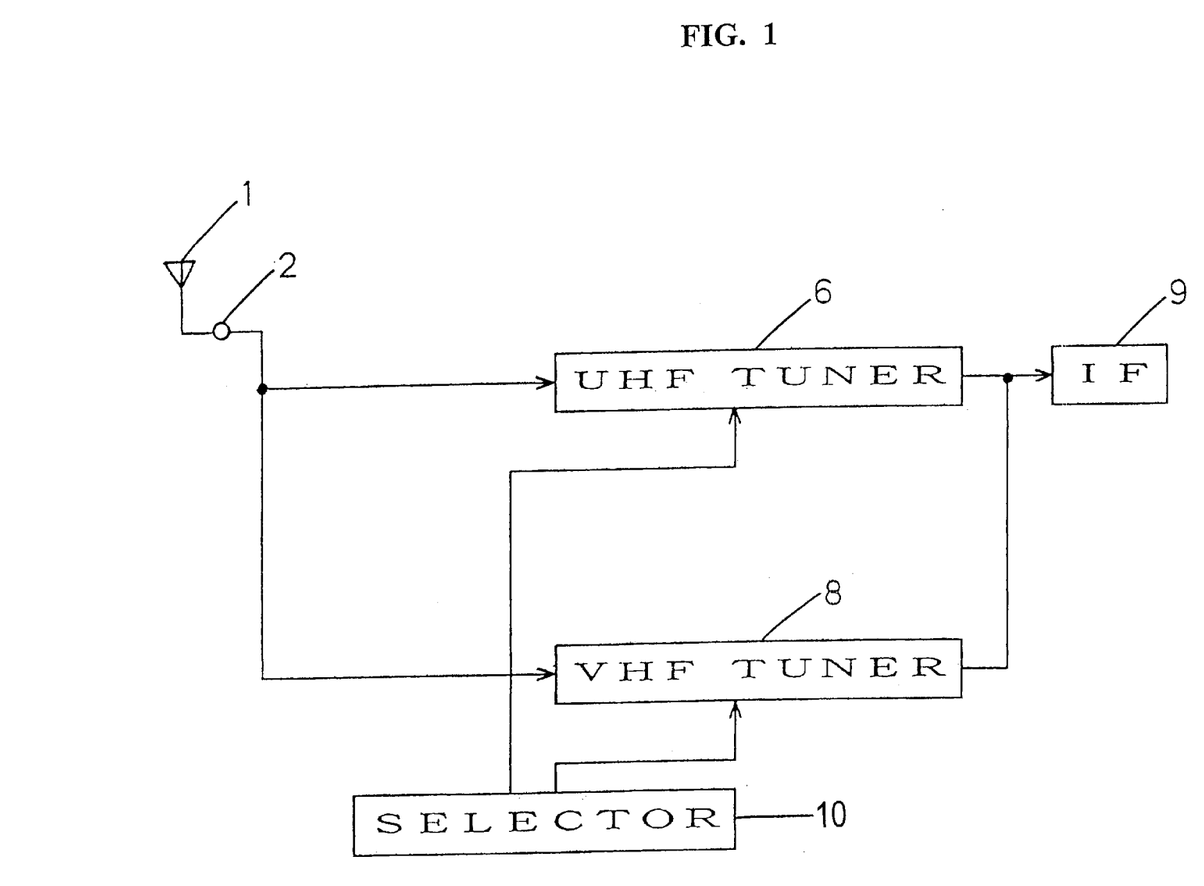
FIG. 1 is a block diagram of a TV tuner unit according to the present invention.

FIG. 1 shows a block diagram of a TV tuner unit according to the present invention. The unit includes a UHF tuner 6 and a VHF tuner 8 directly connected to an input terminal 2 coming from an antenna 1 or a CATV input (not shown). The TV tuner has some resemblance to the conventional TV tuner of FIG. 7, except that it does not include the HPF 63, LPF 64, and switches 65 and 67. The block diagram of FIG. 1 also shows an intermediate-frequency amplifier circuit (IF circuit) 9 and a channel selector 10. At least UHF tuner 6 and VHF tuner 8 components of FIG. 1 are configured differently than those depicted in the conventional TV tuner unit of FIG. 7.

Figure 2:
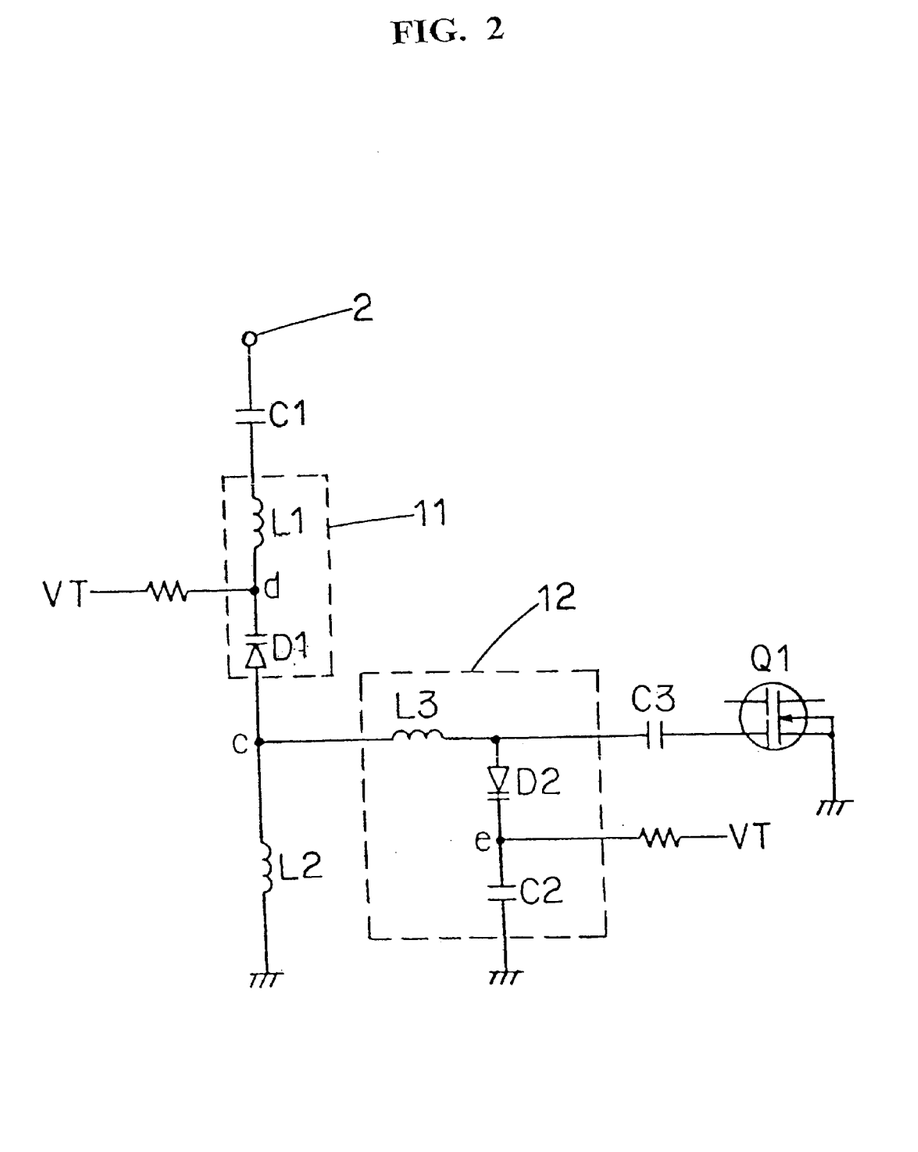
FIG. 2 is a circuit diagram of a main part of the UHF tuner of a TV tuner unit according to the present invention.
Figure 3:
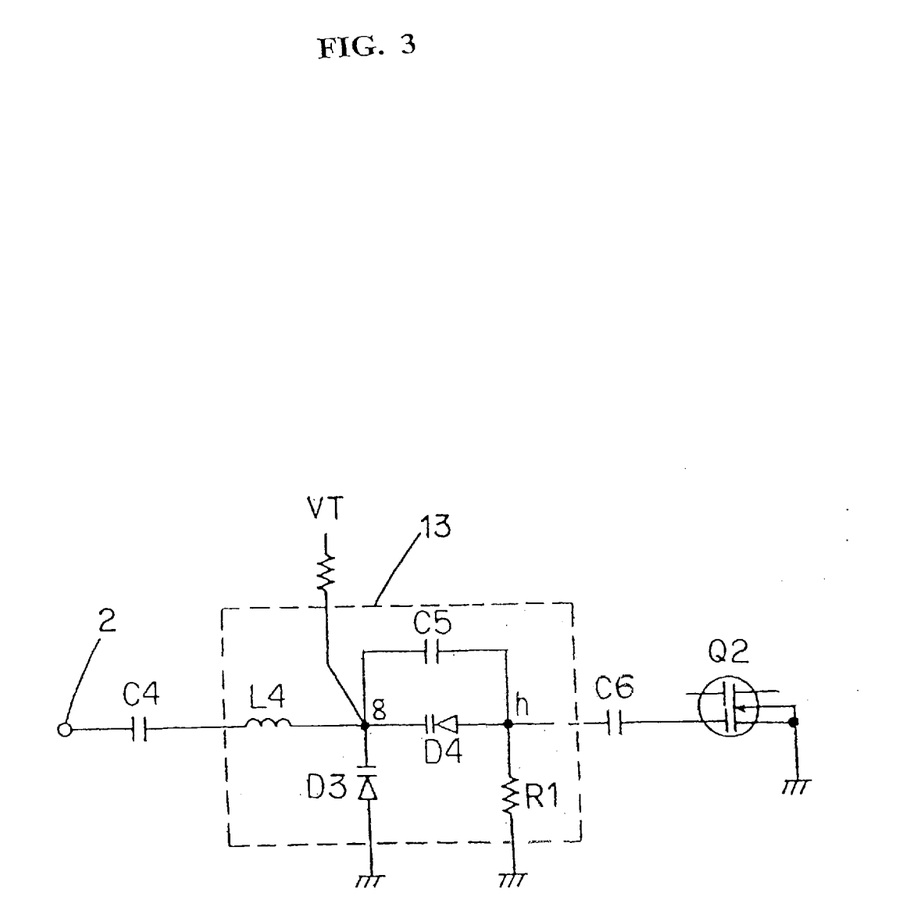
FIG. 3 is a circuit diagram of a main part of the VHF tuner of a TV tuner unit according to the present invention.

FIGS. 2 and 3 show a circuit diagram of the main part of the UHF tuner 6 and the VHF tuner 8 of FIG. 1, respectively.

Figure 5:
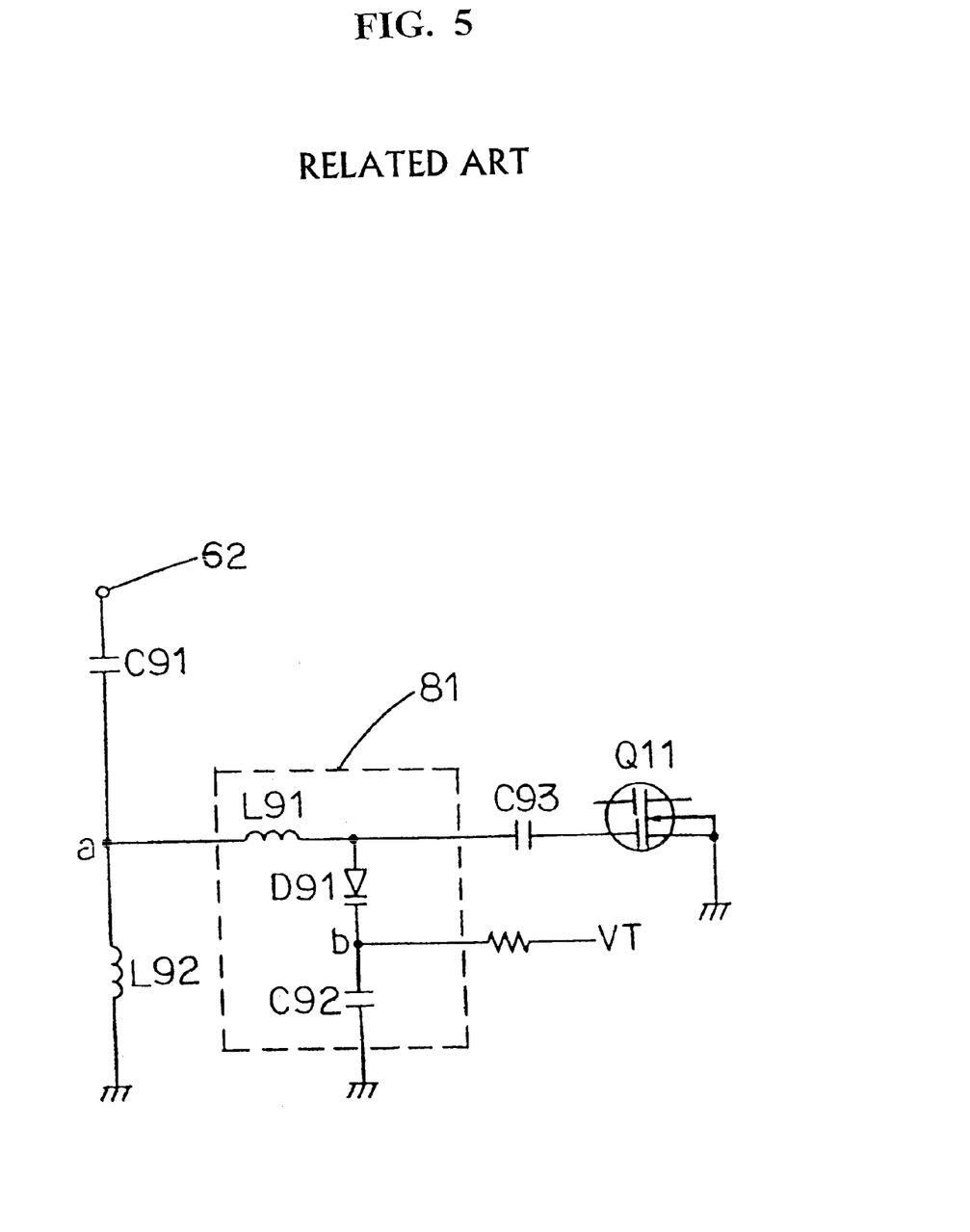
FIG. 5 is a circuit diagram of a main part of the UHF tuner of the prior art.

The UHF tuner 6 according to the present invention as shown in FIG. 2 will now be described in comparison with the conventional UHF tuner as shown in FIG. 5.

First, the conventional UHF tuner of FIG. 5 is described in detail. In FIG. 5, a series of a coupling capacitor C91 and an inductor L92 is connected between an antenna input terminal 62 and ground. One end of another inductor L91 connects to the junction a of the coupling capacitor C91 and the inductor L92, while the other end of the inductor L91 connects to the anode of a variable-capacitance diode D91. The cathode of the variable-capacitance diode D91 connects to a capacitor C92 to ground. The other end of the inductor L91 also connects to a coupling capacitor C93 to the gate of a first-stage amplifier (FET) Q11.

The combined inductor L91, variable-capacitance diode D91, and capacitor C92 form a resonance circuit 81 as a whole. Tuning voltage VT is applied at the junction b of the variable-capacitance diode D91 and the capacitor C92 to control the capacitance of the variable-capacitance diode D91, thereby tuning the resonance circuit 81 to a desired channel and sending the selected channel signal to the first-stage amplifier (FET) Q11. Although not shown in FIG. 5, HPF 63 and switch 65 are connected between the input terminal 62 and the capacitor C91 as shown in FIG. 7.

Now, the UHF tuner 6 according to the present invention is described in detail with reference to FIG. 2. In FIG. 2, coupling capacitor C1, an inductor L1, a variable-capacitance diode D1, and another inductor L2 are serially connected together between an antenna input terminal 2 and ground. One end of another inductor L3 connects to the junction c of the variable-capacitance diode D1 and the inductor L2, while the other end of the inductor L3 connects to the anode of another variable-capacitance diode D2. The cathode of the variable-capacitance diode D2 connects to a capacitor C2 to ground. The other end of the inductor L3 also connects to a coupling capacitor C3 to the gate of a first-stage amplifier (FET) Q1.

The combined inductor Li and variable-capacitance diode Di form a series resonance network 11 as a whole, which is an important aspect of the present invention. The combined inductor L3, variable-capacitance diode D2, and capacitor C2 form a resonance circuit 12 as a whole. Tuning voltage VT is applied at the junction e of the variable-capacitance diode D2 and the capacitor C2 to control the capacitance of the variable-capacitance diode D2, thereby tuning the resonance network 12 to a desired channel and sending the selected channel signal to the first-stage amplifier (FET) Q1.

The series resonance network 11 of the inductor L1 and the variable-capacitance diode D1 as placed before the conventional resonance circuit 12 provides for satisfactory selectivity with no additional HPF or switch.

Figure 6:
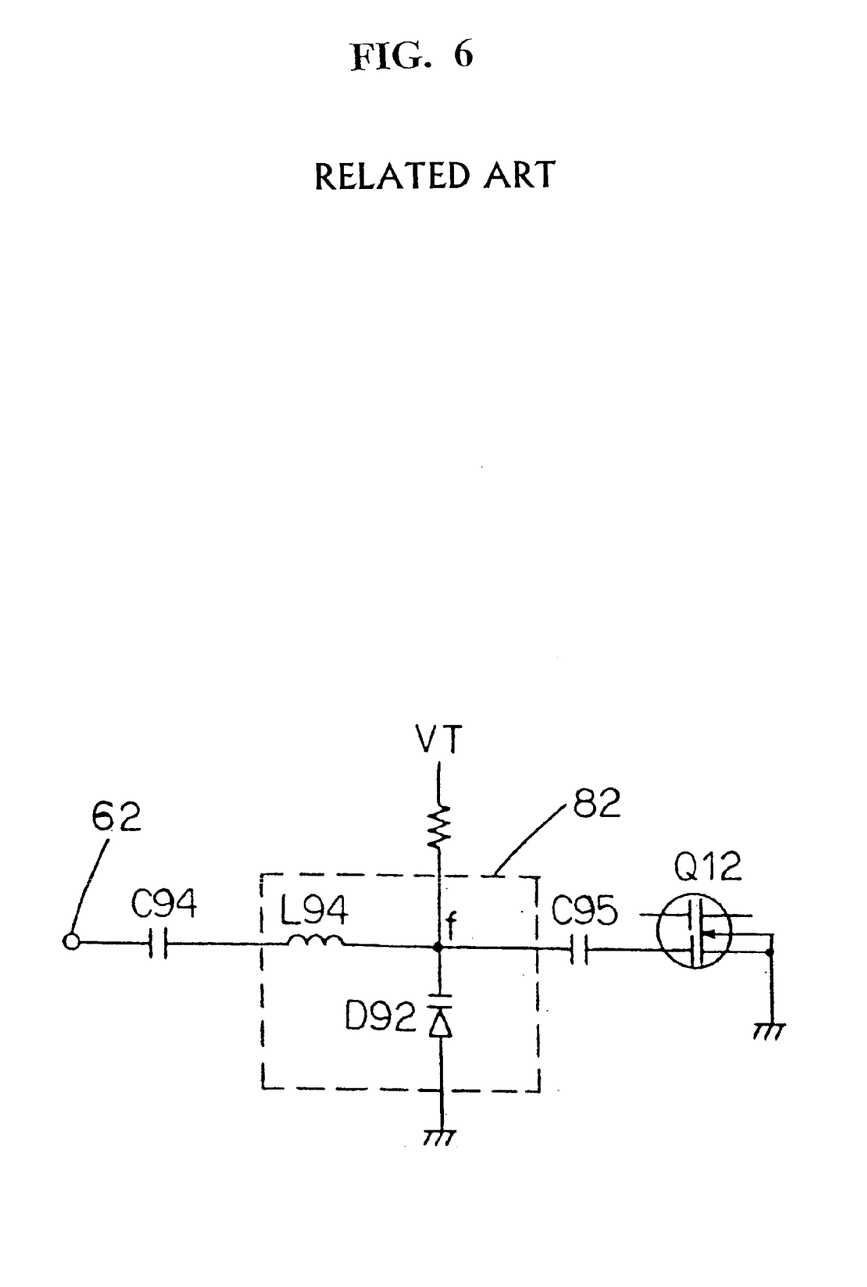
FIG. 6 is a circuit diagram of a main part of the VHF tuner of the prior art.

Now the VHF tuner 8 according to the present invention as shown in FIG. 3 is described below in comparison with the conventional VHF tuner as shown in FIG. 6.

First, the conventional VHF tuner of FIG. 6 is described in detail. In FIG. 6, a series of a coupling capacitor C94, an inductor L94, and another coupling capacitor C95 is connected between an antenna input terminal 62 and a first-stage amplifier (FET) Q12. The cathode of a variable-capacitance diode D92 connects to the junction f of the inductor L94 and the coupling capacitor C95. The anode of the variable-capacitance diode D92 is grounded.

The combined inductor L94 and variable-capacitance diode D92 form a resonance circuit 82 as whole. Tuning voltage VT is applied at the junction f to control the capacitance of the variable-capacitance diode D92, thereby tuning the resonance circuit 82 to a desired channel and sending the selected channel signal to the first-stage amplifier (FET) Q12. Although not shown in FIG. 6, LPF 64 and switch 67 are connected between the input terminal 62 and the capacitor C94 as shown in FIG. 7.

Now, the VHF tuner 8 according to the present invention is described in detail with reference to FIG. 3. In FIG. 3, a series of a coupling capacitor C4, an inductor L4, a variable-capacitance diode D4 and another capacitor C6 is connected between an antenna input terminal 2 and a first-stage amplifier (FET) Q2. The cathode of another variable-capacitance diode D3 connects to the junction g of the inductor L4 and the variable-capacitance diode D4. The anode of the variable-capacitance diode D3 is grounded. A capacitor C5 is connected in parallel with the variable-capacitance diode D4 at the junction g and the junction h is grounded through a bias resistor R1. The capacitor C5 is used to add to the capacitance of the variable-capacitance diode D4. The bias resistor R1 is used to apply a bias voltage to the variable-capacitance diode D4.

When compared with the conventional VHF tuner 6 of FIG. 6, the present VHF tuner 8 of FIG. 3 is further provided with the variable-capacitance diode D4, capacitor C5, and bias resistor R1, thereby forming a resonance network 13 including the inductor L4, the variable-capacitance diodes D3 and D4, and the capacitor C5. Tuning voltage VT is applied at the junction g to control the capacitance of the variable-capacitance diodes D3 and D4, thereby tuning the resonance network 13 to a desired channel and sending the selected channel signal to the first-stage amplifier (FET) Q2.

The added variable-capacitance diode D4 provides for satisfactory selectivity with no additional LPF or switch.

Figure 4:
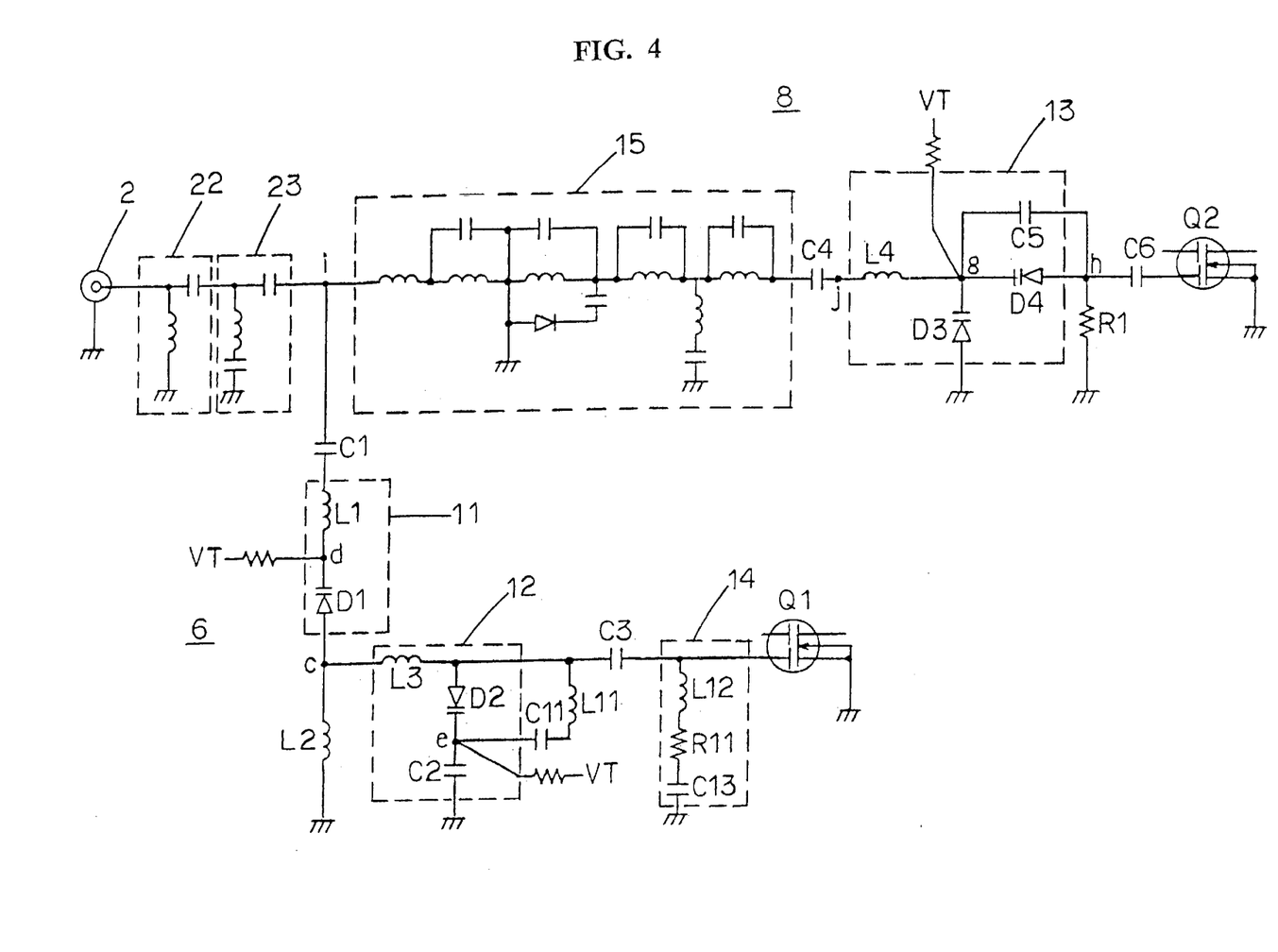
FIG. 4 is a circuit diagram of an embodiment of an input stage of a TV tuner unit according to the present invention.

FIG. 4 is a circuit diagram of an input stage of a TV tuner unit according to the present invention comprising the UHF tuner of FIG. 2 and the VHF tuner of FIG. 3. Each reference number as used in FIG. 2 or 3 is also used in FIG. 4 for referring to the same component.

In FIG. 4, a two-stage filter of HPF 22 and HPF 23 is connected to an antenna input terminal 2 to filter out any lower-frequency noise. The output from HPF 23 is divided into two inputs to the UHF tuner 6 and VHF tuner 8.

As described earlier using FIG. 2, the UHF tuner 6 has a serial connection of a coupling capacitor C1, an inductor L1 and a variable-capacitance diode D1, and another inductor L2 connected together between the junction i at the output of HPF 23 and ground.

One end of another inductor L3 connects to the junction c of the variable-capacitance diode D1 and the inductor L2, while the other end of the inductor L3 connects to the anode of another variable-capacitance diode D2. The cathode of the variable-capacitance diode D2 connects to a capacitor C2 to ground. The other end of the inductor L3 also connects to a coupling capacitor C3 to a trap network 14 including an inductor L12, a resistor R11, and a capacitor C13, as well as to the gate of a first-stage amplifier (FET) Q1.

Referring now to the VHF tuner 8, a multi-stage trap network 15 is connected to the junction i at the output of HPF 23. As described earlier using FIG. 3, a series of a coupling capacitor C4, an inductor L4, a variable-capacitance diode D4 and another coupling capacitor C6 is connected between the output of the multi-stage trap network 15 and a first-stage amplifier (FET) Q2. The cathode of another variable-capacitance diode D3 connects to the junction g of the inductor L4 and the variable-capacitance diode D4. The anode of the variable-capacitance diode D3 is grounded. A capacitor C5 is connected in parallel with the variable-capacitance diode D4 at the junction g and the junction h of the variable-capacitance diode D4 and the capacitor C6. The junction h is grounded through a bias resistor R1.

The variable-capacitance diode D4 may be moved to another place to provide for the same selectivity. For example, it may be moved to the junction j of the capacitor C4 and the inductor L4 such that its cathode connects to the junction j and its anode is grounded.

It will be apparent to those skilled in the art that other modifications and variations can be made in the television tuner unit of the present invention and in construction of this television tuner unit without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A television tuner unit comprising:
   a television signal input terminal providing both UHF and VHF input signals;
   a UHF tuner comprising a UHF resonance circuit for tuning to a desired channel in response to application of a tuning voltage to the UHF resonance circuit;
   a VHF tuner comprising a VHF resonance circuit for tuning to a desired channel in response to application of a tuning voltage to the VHF resonance circuit; and
   a resonance network, included in at least one of the UHF tuner and the VHF tuner, for controlling selection of a signal to be applied to the resonance circuit of the tuner in which the resonance network is included so as to select one of UHF and VHF tuning without the use of a UHF/VHF switching arrangement and control between the UHF and VHF tuners.

2. The television tuner unit of claim 1, wherein:
   the UHF tuner comprises a resonance network for selecting the UHF input signals from the television signal input terminal for application to the UHF resonance circuit of the UHF tuner; and
   the VHF tuner comprises a resonance network for selecting the VHF input signals from the television signal input terminal for application to the VHF resonance circuit of the VHF tuner.

3. The television tuner unit of claim 2, wherein the television tuner unit is configured so that the UHF and VHF tuners are both coupled to the television signal input terminal without any switch positioned between the input terminal and either of the tuners.

4. The television tuner unit of claim 2, wherein the television tuner unit is configured so that the UHF and VHF tuners are both coupled to a junction at which a path to the UHF tuner and a path to the VHF tuner diverge without any high pass filter positioned between the UHF tuner and the junction and without any low pass filter positioned between the VHF tuner and the junction.

5. The television tuner unit of claim 2, wherein the resonance network of the UHF tuner comprises an inductor and a variable-capacitance diode coupled between the television signal input terminal and an input of the resonance circuit of the UHF tuner.

6. The television tuner unit of claim 2, wherein the resonance network of the VHF tuner comprises an inductor, at least one variable-capacitance diode, and a capacitor.

7. The television tuner unit of claim 2, wherein the resonance network of the VHF tuner comprises an inductor, multiple variable-capacitance diodes, and a capacitor.

8. The television tuner unit of claim 7, wherein the capacitor is coupled in parallel with at least one of the variable-capacitance diodes.

9. The television tuner unit of claim 2, further comprising a multi-stage trap network coupled between the television signal input terminal and the VHF tuner.

10. The television tuner unit of claim 1, further comprising:
    a channel selector, coupled to the UHF and VHF tuners, for controlling channel selection by the tuners; and
    an intermediate frequency (IF) amplifier circuit coupled to an output of each of the UHF and VHF tuners.

11. The television tuner unit of claim 1, wherein the UHF and VHF input signals are provided to the television signal input terminal from an antenna.

12. The television tuner unit of claim 1, wherein the UHF and VHF input signals are provided to the television signal input terminal from a CATV input.

13. The television tuner unit of claim 1, further comprising a multi-stage trap network coupled between the television signal input terminal and the VHF tuner.

14. The television tuner unit of claim 1, wherein the television tuner unit is configured so that the UHF and VHF tuners are both coupled to the television signal input terminal without any switch positioned between the input terminal and either of the tuners.

15. The television tuner unit of claim 1, wherein the television tuner unit is configured so that the UHF and VHF tuners are both coupled to a junction at which a path to the UHF tuner and a path to the VHF tuner diverge without any high pass filter positioned between the UHF tuner and the junction and without any low pass filter positioned between the VHF tuner and the junction.

16. The television tuner unit of claim 1, wherein a resonance network of the UHF tuner comprises an inductor and a variable-capacitance diode coupled between the television signal input terminal and an input of the resonance circuit of the UHF tuner.

17. The television tuner unit of claim 1, wherein a resonance network of the VHF tuner comprises an inductor, at least one variable-capacitance diode, and a capacitor.

18. The television tuner unit of claim 1, wherein a resonance network of the VHF tuner comprises an inductor, multiple variable-capacitance diodes, and a capacitor.

19. A television tuner unit comprising:

a television signal input terminal;

a UHF tuner comprising a UHF resonance circuit for tuning to a desired channel in response to application of a tuning voltage to the UHF resonance circuit; and a VHF tuner comprising a VHF resonance circuit for tuning to a desired channel in response to application of a tuning voltage to the VHF resonance circuit;

wherein the television tuner unit is configured so that the UHF and VHF tuners are both coupled to the television signal input terminal without any UHF/VHF selection switch and control between the tuners.

20. The television tuner unit of claim 19, wherein the television tuner unit is configured so that the UHF and VHF tuners are both coupled to a junction at which a path to the UHF tuner and a path to the VHF tuner diverge without any high pass filter positioned between the UHF tuner and the junction and without any low pass filter positioned between the VHF tuner and the junction.

21. The television tuner unit of claim 19, further comprising:

a channel selector, coupled to the UHF and VHF tuners, for controlling channel selection by the tuners; and an intermediate frequency (IF) amplifier circuit coupled at an output of each of the UHF and VHF tuners.

22. The television tuner unit of claim 19, wherein the UHF and VHF input signals are provided to the television signal input terminal from an antenna.

23. The television tuner unit of claim 19, wherein the UHF and VHF input signals are provided to the television signal input terminal from a CATV input.

24. A television tuner unit comprising:

a television signal input terminal providing both UHF and VHF input signals;

a UHF tuner comprising internal UHF/VHF separation circuitry and a UHF resonance circuit for tuning to a desired channel in response to application of a tuning voltage to the UHF resonance circuit;

a VHF tuner comprising internal UHF/VHF separation circuitry and a VHF resonance circuit for tuning to a desired channel in response to application of a tuning voltage to the VHF resonance circuit;

the internal UHF/VHF separation circuitry of each of the UHF and VHF tuners controlling selection of a signal to be applied to the resonance circuit of the tuner in which the internal UHF/VHF separation circuitry is included so as to select one of UHF and VHF tuning without the use of a UHF/VHF switching arrangement and control between the UHF and VHF tuners; and a channel selector, having outputs coupled only to the UHF and VHF tuners, for controlling channel selection by the tuners, wherein the television tuner unit is configured so that the UHF and VHF tuners are both coupled to a junction at which a path to the UHF tuner and a path to the VHF tuner diverge without any high pass filter positioned between the UHF tuner and the junction and without any low pass filter positioned between the VHF tuner and the junction.

25. A television tuner unit comprising:

a television signal input terminal;

a UHF tuner comprising internal UHF/VHF separation circuitry and a UHF resonance circuit for tuning to a desired channel in response to application of a tuning voltage to the UHF resonance circuit;

a VHF tuner comprising internal UHF/VHF separation circuitry and a VHF resonance circuit for tuning to a desired channel in response to application of a tuning voltage to the VHF resonance circuit; and a channel selector, having outputs coupled only to the UHF and VHF tuners, for controlling channel selection by the tuners, wherein the television tuner unit is configured so that the UHF and VHF tuners are both coupled to a junction at which a path to the UHF tuner and a path to the VHF tuner diverge without any high pass filter positioned between the UHF tuner and the junction and without any low pass filter positioned between the VHF tuner and the junction, and wherein the television tuner unit is configured so that the UHF and VHF tuners are both coupled to the television signal input terminal without any UHF/VHF selection switch and control between the tuners.

* * * * *